(12) United States Patent
Vilenskiy et al.

(10) Patent No.: US 10,594,289 B2
(45) Date of Patent: Mar. 17, 2020

(54) APPARATUS AND METHOD FOR CONTROLLING PHASE OF SIGNAL

(71) Applicant: Samsung Electronics Co., Ltd., Suwon-si, Gyeonggi-do (KR)

(72) Inventors: Artem Rudolfovitch Vilenskiy, Moscow (RU); Mikhail Nikolaevich Makurin, Arkhangelsk (RU); Nikolay Nikolayevich Olyunin, Perm (RU)

(73) Assignee: Samsung Electronics Co., Ltd., Suwon-si (KR)

( * ) Notice: Subject to any disclaimer, the term of this patent is extended or adjusted under 35 U.S.C. 154(b) by 90 days.

(21) Appl. No.: 15/853,115

(22) Filed: Dec. 22, 2017

(65) Prior Publication Data

US 2018/0183402 A1 Jun. 28, 2018

(30) Foreign Application Priority Data

Dec. 22, 2016 (RU) .................................. 2016150642
Dec. 22, 2017 (KR) ......................... 10-2017-0178071

(51) Int. Cl.
*H03H 7/20* (2006.01)
*H01P 1/18* (2006.01)
*H01P 5/22* (2006.01)

(52) U.S. Cl.
CPC ............... *H03H 7/20* (2013.01); *H01P 1/184* (2013.01); *H01P 5/22* (2013.01)

(58) Field of Classification Search
CPC ... H03H 7/20; H01P 1/184; H01P 5/22; H01P 1/18

USPC .................... 333/116, 117, 139, 156, 161
See application file for complete search history.

(56) References Cited

U.S. PATENT DOCUMENTS

| | | | |
|---|---|---|---|
| 3,423,699 A | 1/1969 | Hines | |
| 3,931,599 A | 1/1976 | Salzberg | |
| 4,205,282 A | 5/1980 | Gipprich | |
| 4,638,269 A | 1/1987 | Dawson et al. | |
| 6,710,679 B2 | 3/2004 | Zhu | |
| 7,969,359 B2 | 6/2011 | Krishnaswamy et al. | |
| 2014/0320240 A1* | 10/2014 | Anegawa ............... | H03G 1/007 333/81 R |
| 2015/0188595 A1* | 7/2015 | Black ................... | H03H 7/0153 455/77 |

OTHER PUBLICATIONS

Federal Service on Industrial Property [RU], "Official Action and Search Report," Russian Application No. 2016150642/28(081231), dated Dec. 22, 2016, 11 pages.

* cited by examiner

*Primary Examiner* — Robert J Pascal
*Assistant Examiner* — Jorge L Salazar, Jr.

(57) ABSTRACT

The present disclosure relates to an analog phase shifter for mitigating transmission losses. The analog phase shifter includes a multi-port network including an input port for inputting an RF signal and an output port for outputting a phase-changed RF signal. The analog phase shifter further includes a hybrid coupler configured to operably couple the input port and the output port to a plurality of load ports. The analog phase shifter additionally includes tunable reflective loads coupled to the hybrid coupler through the plurality of load ports. Load values of the tunable reflective loads are tuned by applying a plurality of independent voltages.

17 Claims, 10 Drawing Sheets

APPARATUS AND METHOD FOR CONTROLLING PHASE OF SIGNAL

CROSS-REFERENCE TO RELATED APPLICATIONS AND CLAIM OF PRIORITY

This application is related to and claims priority to Russian Patent Application No. 2016150642 filed on Dec. 22, 2016, and Korean Patent Application No. 10-2017-0178071 filed on Dec. 22, 2017, the contents of which are incorporated herein by reference.

TECHNICAL FIELD

The present disclosure generally relates to the field of microwave analog devices for phase shifting, and more particularly, to a microwave analog phase shifter based on tunable capacitances.

BACKGROUND

Main areas of the microwave analog phase shifters application are antenna arrays, such as focusing control for radar and communication antennas and array beam steering, and use as microwave wireless power transport (WPT) chargers. Furthermore, the microwave analog phase shifters may be used as phase modulators for modulating a phase of an input radio frequency (RF) signal.

General requirements for the microwave analog phase shifters are 360° phase shift, low insertion loss, low transmission coefficient ripple, compact size, printed circuit board (PCB) integrability as well as low cost.

Tunable elements which are traditionally used in the microwave analog phase shifters may include semiconductors and dielectric varactors, and piezoelectric capacitors. The most common design of the analog phase shifters with tunable capacitances includes a 3-dB hybrid coupler (a 2-branch line coupler, a rat-race coupler, a Lange coupler, or the like) with a tunable reflective load. The tunable reflective load usually includes two tunable capacitors that are tuned simultaneously by applying a varying direct current (DC) voltage. As a result, the losses occur that are caused by an inner resonance within a reflective load structure. The resonance losses lead to the high attenuation of an RF output signal and parasitic amplitude modulation. Such phenomena may degrade system performance, that is, may reduce array gain (if used in antenna arrays), or may distort a signal spectrum (if used in a phase modulator).

Known in the art is a phase shifter disclosed in U.S. Pat. No. 7,969,359 B2. US' 359 B2 teaches a phase shifter including: a hybrid coupler which is ground shielded and includes differential coplanar strip lines placed one on top of the other using different metal layers so that signal coupling occurs vertically; and reflective terminations which are connected to the hybrid coupler such that when the hybrid coupler is connected to the reflective terminations, a phase shifter is formed, the reflective terminations each including a parallel LC circuit. Disadvantages of the known solution are high resonance losses, high ripple, and high sensitivity of a phase response to voltage changes.

In addition, known in the art is a phase shifter disclosed in U.S. Pat. No. 6,710,679 B2 (U.S. '679). U.S. '679 teaches a 360° analog dielectric varactor phase shifter, including a 180° analog rat-race ring phase shifter, and a 180° digital switch line phase shifter, and the digital phase shifter includes first and second microstrip lines connected to each other through capacitors. One of the above microstrip lines serves as a 180° phase shift line and another microstrip line serves as a reference lines. Disadvantages of the known solutions are very bulky design and high resonance losses.

Therefore, in designing a phase shifter, there is a demand for a solution having a simplified design and a reduced size with minimal losses to maintain the same amplitude ripple and a 360° phase range.

SUMMARY

To address the above-discussed deficiencies, it is a primary object to provide at least the advantages described below. Accordingly, the present disclosure provides an apparatus and a method for reducing average losses and reducing a transmission ripple in an analog phase shifter.

Another aspect of the present disclosure provides an apparatus and a method for mitigating an inner resonance of reflective loads in an analog phase shifter.

Furthermore, another aspect of the present disclosure provides an apparatus and a method for solving a problem of self-resonance of reflective loads in an analog phase shifter.

According to an aspect of the present disclosure, there is provided an analog phase shifter including: a multi-port network with an input port for inputting an RF signal and an output port for outputting a phase-changed RF signal; a hybrid coupler configured to electrically couple the input port and the output port to a plurality of load ports; and tunable reflective loads coupled to the hybrid coupler through the plurality of load ports, wherein load values of the tunable reflective loads are tuned by applying a plurality of independent voltages.

According to another aspect of the present disclosure, there is provided an operating method of an analog phase shifter including: receiving an input on a phase shift; determining control voltage values corresponding to the input and applying the determined control voltage values to varying loads.

The apparatus and the method according to various embodiments of the present disclosure can reduce average losses and ripple by mitigating an inner resonance of a microwave analog phase shifter.

The main technical effect achieved by the present disclosure is reduced and equalized transmission losses during the use of the proposed device. The above results in a higher data transmission rate provided for communication systems, higher operating range provided for radar systems, and higher power transmission efficiency provided for WPT systems. The proposed analog phase shifter has two independent control channels whereby each capacitance of the reflective load is tuned independently. Hence, the inner resonance may be mitigated by a successive manipulation of both channels using a control program which is optimized by the analysis of phase and losses functions of the control voltages. Lowered losses lead to the higher efficiency of the proposed device, namely, the higher data transmission rate and longer operating distances can be provided. Furthermore, a lowered ripple causes no parasitic modulation. Hence, a higher signal integrity is provided during the use of the disclosed apparatus and method.

The effects achieved by the present disclosure are not limited to the above-mentioned effects, and other effects that are not mentioned herein could be clearly understood by a person skilled in the art from the following description.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The terms used in the present disclosure are just for the purpose of describing particular exemplary embodiments, and are not intended to limit the scope of other embodiments. The singular forms are intended to include the plural forms as well, unless the context clearly indicates otherwise. All of the terms used herein including technical or scientific terms may have the same meanings as those generally understood by an ordinary skilled person in the related art. From among the terms used in the present disclosure, the terms defined in a generally used dictionary should be interpreted as having the same or similar meanings as or to the contextual meanings of the relevant technology, and should not be interpreted as having ideal or exaggerated meanings unless they are clearly defined in the present disclosure. According to circumstances, even the terms defined in the present disclosure should not be interpreted as excluding the embodiments of the present disclosure.

In various embodiments of the present disclosure which will be described hereinbelow, hardware-level approach methods will be described by way of an example. However, since various embodiments of the present disclosure include technology using both hardware and software, various embodiments of the present disclosure do not exclude software-based approach methods.

The present disclosure relates to an apparatus and a method for controlling a reflective load in a phase shifter. Specifically, the present disclosure describes technology for independently tuning each capacitance of a reflective load in a phase shifter.

The terms used in the following description to indicate elements of the apparatus (a varactor, a microstrip, a coupler, a port, or the like) are merely examples for convenience of explanation. Therefore, the present disclosure is not limited to the terms described below, and other terms having the same technical meanings may be used.

In addition, the present disclosure will be described with various embodiments using a hybrid coupler, but this is merely an example for convenience of explanation. Various embodiments of the present disclosure may be easily modified and applied to other couplers (for example, a rat-race coupler, a Lange coupler).

Figure 1:
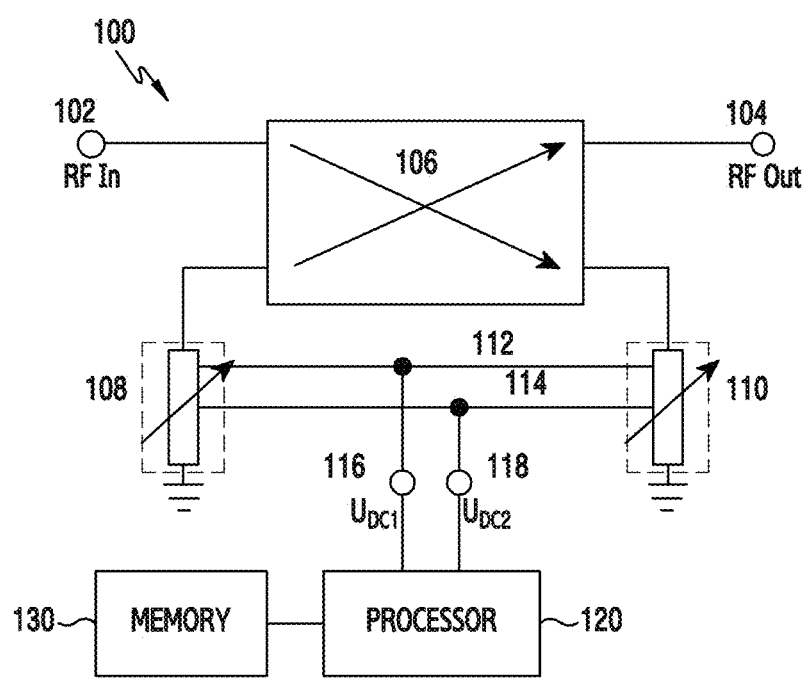
FIG. 1 illustrates a view showing a structural diagram of a phase shifter according to various embodiments of the present disclosure.

FIG. 1 shows a structural diagram of a phase shifter according to various embodiments of the present disclosure.

Referring to FIG. 1, the phase shifter 100 includes an RF input port 102, an RF output port 104, a three-decibel (dB) hybrid coupler 106, tunable reflective loads 108 and 110, independent control channels 112 and 114, DC ports 116 and 118, a processor 120, and a memory 130.

The RF input port 102 and the RF output port 104 may form a network having two ports of the phase shifter, and the 3-dB hybrid coupler 106 may electrically couple the RF input port 102 and the RF output port 104 to load ports including two identical tunable reflective loads 108 and 110. The tunable reflective loads 108 and 110 may have the same structure, and the control channels 112 and 114 may be connected to the tunable reflective loads 108 and 110 to independently control capacitance of each of the reflective loads. The processor 120 may input a voltage for phase control through the DC ports 116 and 118. The memory 130 may store a table indicating a relationship between capacitance of each of the varactors which are tuned by voltage vales applied to the DC ports 116 and 118, and a corresponding reflection coefficient.

Each reflective load ideally should exhibit as a perfect reflector. That is, each reflective load should have a constant magnitude of a reflection coefficient close to 1 (0 dB) and a phase varying from 0 to 360 degrees or from 0 to −360 degrees. To achieve such operation parameters, each reflective load contains at least two tunable capacitors. The reflection coefficient phase may be changed by varying the capacitance of each capacitor. Unfortunately, each capacitor (semiconductor, dielectric varactor, etc.) at microwave frequencies has some parasitic losses. Thus, the magnitude of the reflection coefficient also varies during phase shifting. This parasitic amplitude modulation (ripple) is well known for simple reflective load structures and causes phase shifter transmission resonance losses when the two capacitors with the reflective load achieve 360 degrees. Phase shifting using one control voltage is performed, that is, two capacitors are tuned simultaneously. The present disclosure aims at reducing average reflective load losses and a parasitic ripple by a reflective load structure modification and implementation of an optimal algorithm for a capacitor control.

According to various embodiments of the present disclosure, the hybrid coupler may be implemented as a microstrip or coplanar two-branch line coupler having two similar reflective loads connected to load ports of the coupler, and the load ports are coupled to the input port of the coupler.

Each reflective load may consist of two similar varactor diodes (referred to as varactors) having coplanar transmission lines or microstrip of a predetermined length and characteristic impedance therebetween as described in detail below. Each varactor defines a varactor section including the varactor and a segment of a tuning microstrip or a coplanar line terminated by a shorted circuit or an open circuit on the end of the varactor. Each varactor includes its own DC control port connected thereto through a DC filter. When the tuning lines of the varactor are open ended, a DC port may be connected to these lines, while the transmission line between two varactors may be shorted through another DC filter. In the other case, when tuning lines are shorted, each varactor may be biased by a separate DC port connected to the transmission line between two varactors. In this case, two DC ports should be isolated by an additional blocking capacitance inserted inside a gap in the line. In other words, a blocking capacitor connected in series with the transmission line should be provided. Two varactors are tuned independently to achieve the best performance in terms of the transmission losses.

When phase shifting using one control voltage is performed, i.e., both capacitors are tuned simultaneously, the present disclosure aims at reducing average reflective load losses and a parasitic ripple by a reflective load structure modification and implementation of an optimal algorithm for capacitor control.

Although FIG. 1 depicts the phase shifter including a network having two ports, a hybrid coupler having two load ports, two reflective loads, and two DC ports, the present disclosure is not limited thereto. The phase shifter according to the present disclosure may include three or more load ports, three or more input and output ports, three or more reflective loads, and three or more DC ports.

The analog phase shifter may further include a configuration for generating an RF signal although it is not illustrated. Specifically, the phase shifter may further include an amplifier, an oscillator, a multiplier, a mixer, a filter, a duplexer, an isolator, or etc.

Figure 2:
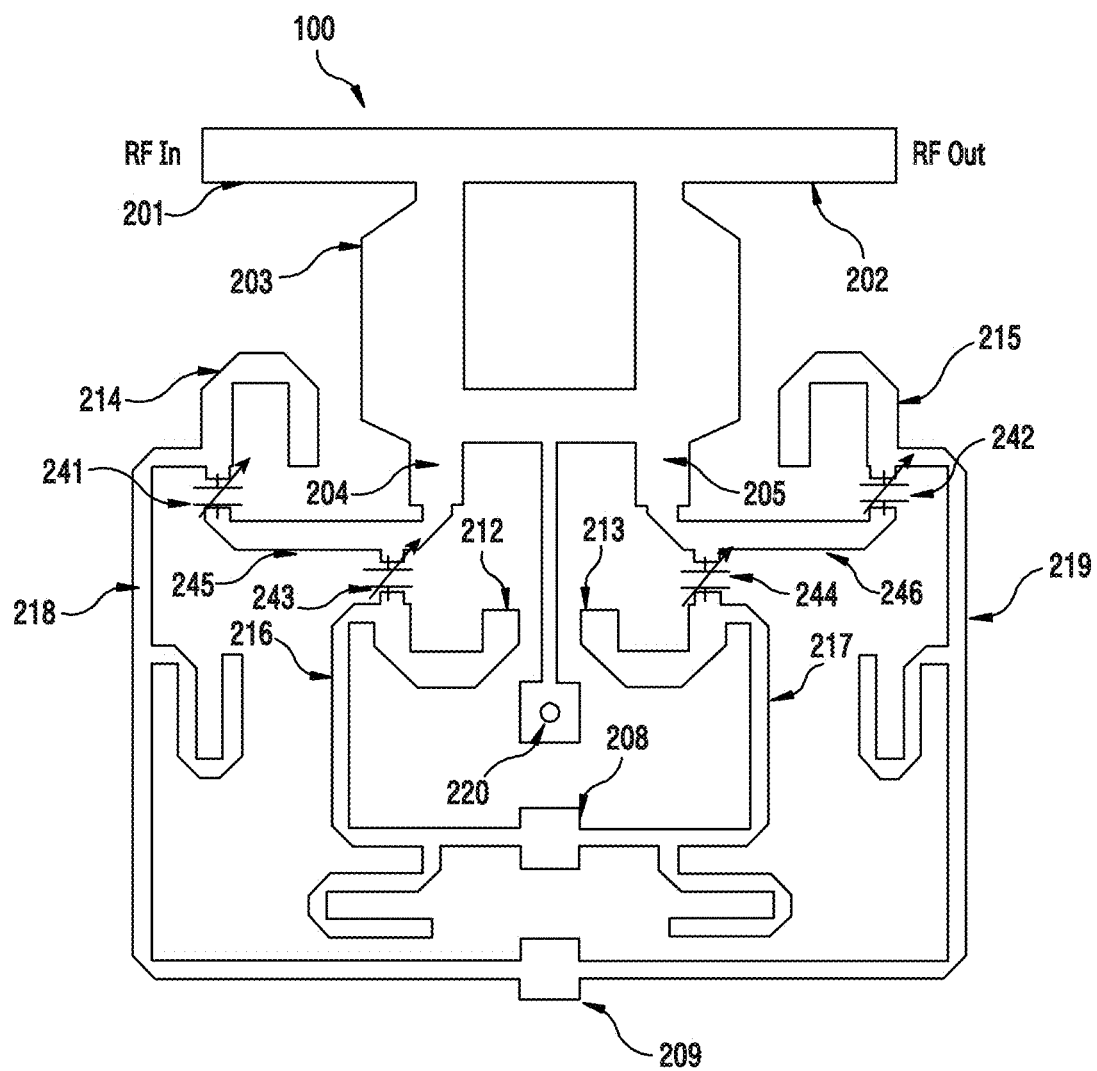
FIG. 2 illustrates a view showing a microstrip layout of a phase shifter according to various embodiments of the present disclosure.

FIG. 2 shows a microstrip layout of a phase shifter according to various embodiments of the present disclosure.

Referring to FIG. 2, the microstrip phase shifter includes an input microstrip line 201, an output microstrip line 202 with characteristic impedance $Z_0$, and a two-branch line 3-dB hybrid coupler having two load ports 204, 205 configured to couple identical reflective loads 108, 110. The characteristic impedance is $Z_0$ for all ports of the 3-dB hybrid coupler. Next, each of the load ports 204, 205 of the coupler 203 is connected to a reflective load input having the characteristic impedance $Z_0$. Thus, the load ports 204, 205 and the reflective load inputs are formed so as to have the same microstrip part. Each reflective load 108, 110 may further include one varactor 243, 244 with capacitance $C_{var2}$ connected in parallel to the input microstrip line. The varactor 243, 244 is connected to another varactor 241, 242 with capacitance $C_{var1}$ through a quarter (¼) wavelength microstrip line, which is also referred to as a transmission line 245, 246. Each of the varactors 241, 242 and 243, 244 may include corresponding tuning microstrip open circuit lines 214, 215 and 212, 214 connected thereto in series to form a tunable varactor section. These lines are used for achieving a desired phase shift by each varactor section. A phase shift desired from each varactor section is usually 180 degrees and tuning line lengths and characteristic impedance are chosen based on varactor tunability. The characteristic impedance of the transmission lines 245, 246 is usually chosen to match the reflective load with the coupler ports, i.e., to achieve the lowest losses and ripple. Herein, the above-described transmission lines may include an open transmission line or a shorted transmission line, and may be desired to achieve a phase shift of 180 degrees. Accordingly, the transmission lines may essentially have an inductive reactance connected to the varactors in series. The difference between the shorted transmission line and the open transmission line is a different length between the above-described lines to achieve a value of the inductance desired for achieving the phase shift of 180 degrees. DC-pass filters 216, 217, 218, 219 are exploited to provide independent varactors for controlling channels 112 and 114 through a voltage applied to the two DC ports 208, 209. In this preferred embodiment, it should be realized that the filters are the same as a microwave stopband filter tuned to $f_0$, where $f_0$ is a center microwave frequency of an operating bandwidth. It should be understood that other possible filters having the same operating characteristics can be used. To maintain a DC ground on the other varactors' contacts, a shorted quarter (¼) wavelength stub 220 is used to ground the coupler 106 together with the reflective loads 108, 110.

Although FIG. 2 has been described based on the phase shifter including a network with two ports, a hybrid coupler with two load ports, two reflective loads, and two DC ports, the present disclosure is not limited thereto. The phase shifter according to the present disclosure may include three or more load ports, three or more input and output ports, three or more reflective loads, and three or more DC ports.

The described design may be manufactured on standard microwave substrates, e.g., Teflon based substrates or alumina substrates, using existing technologies: PCB etching, vacuum deposition, low-temperature co-fried ceramics (LTCC), etc. The microstrip layout may be directly integrated inside a microwave system layout as a part of it, or may be implemented as a separate device with its own housing and connectors (for example, subminiature version A (SMA) connectors).

The presented exemplary layout includes two separated DC ports. As will be described in detail below, the reflective load proposed through FIGS. 3 to 5 may have three different structures. The diagram of each reflective load according to FIGS. 3 to 5 may correspond to the layout of the microstrip of the reflective load illustrated in FIG. 2.

Figure 3:
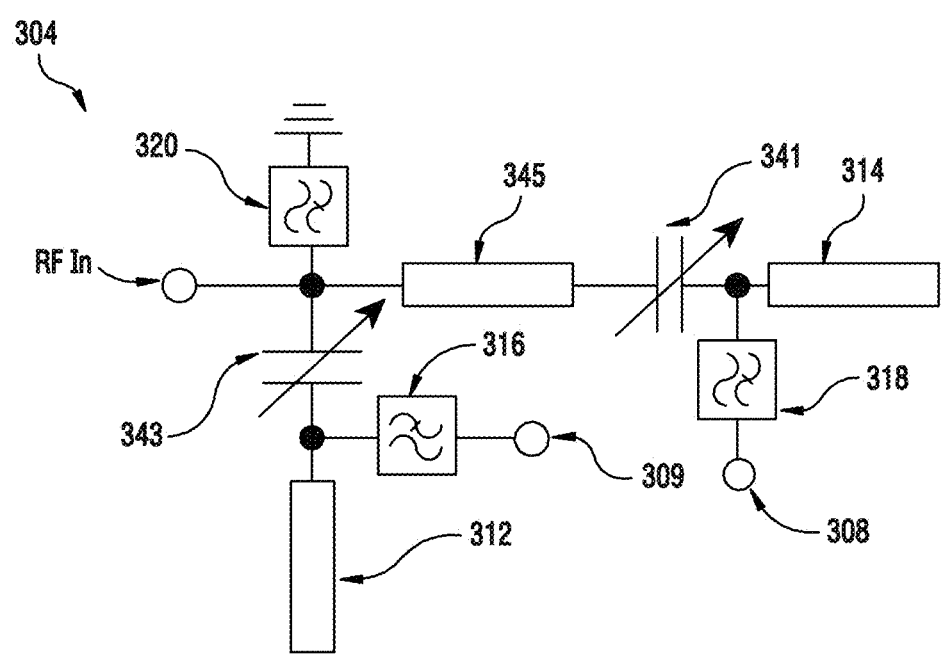
FIG. 3 illustrates a view showing an electrical diagram of a tunable reflective load with open ended lines according to one preferred embodiment of the phase shifter proposed according to various embodiments of the present disclosure.

FIG. 3 shows an electrical diagram of a tunable reflective load with open ended lines according to one preferred embodiment of the phase shifter proposed according to various embodiments of the present disclosure.

Referring to FIG. 3, the tunable reflective load 304 includes two similar tunable capacitances $C_{var1,2}$ (for example, varactors 341, 343) separated by a quarter (¼) wavelength transmission line 345 with characteristic impedance $2Z_0$, where $Z_0$ is the aforementioned reference characteristic impedance.

Each varactor 341, 343 has similar tuning open circuit lines 314, 312 with a length and characteristic impedance chosen to achieve a phase shift of 180 degrees from each varactor section. This choice depends on a varactor tuning range ($C_{max}$ and $C_{min}$) and a value of $Z_0$. The design equation may be derived from the condition of 180 degrees of the phase shift:

$$\left(-\frac{1}{2\pi f_0 C_{min}} + X_s\right) / (2Z_0) = -2Z_0 / \left(-\frac{1}{2\pi f_0 C_{max}} + X_s\right) \quad \text{Equation (1)}$$

where $X_s$ is a full reactance of the tuning open circuit line having the varactor's parasitic inductance, $Z_0$ is characteristic impedance, $f_0$ is a central frequency, $C_{max}$ is a maximal value of the tunable capacitance, and $C_{min}$ is a minimal value of the tunable capacitance. The length of the tuning open circuit line is usually between $\lambda_0/4$ and $\lambda_0/2$, where $\lambda_0$ is a transmission line wavelength at the central frequency $f_0$.

By connecting two DC ports 308, 309 to the tuning open circuit lines 314, 312 through the corresponding DC-pass filters 316, 318, decoupling between the DC ports 308, 309 is achieved. In this case, the transmission line 345 should be grounded through another DC-pass filter 320 to maintain a reference DC voltage level on the varactors' contacts connected to the transmission line 345.

Figure 4:
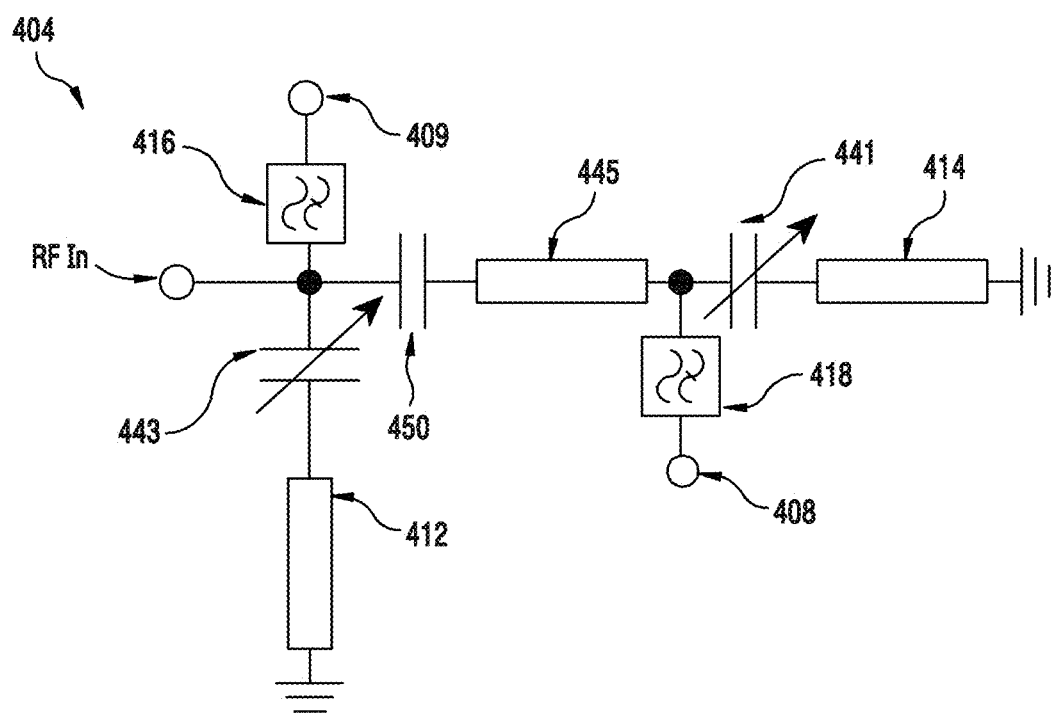
FIG. 4 illustrates a view showing an electrical diagram of a tunable reflective load with shorted lines according to another preferred embodiment of the phase shifter proposed according to various embodiments of the present disclosure.

FIG. 4 shows an electrical diagram of a tunable reflective load with shorted lines according to another preferred embodiment of the phase shifter proposed according to various embodiments of the present disclosure.

Referring to FIG. 4, the tunable reflective load 404 includes the same microwave parts as in the embodiment according to FIG. 3. However, tuning lines 412, 414 are shorted. A length and characteristic impedance of the tuning shorted lines 412, 414 are calculated from the Equation (1), where $X_s$ is a full reactance of the tuning shorted line having the varactor's parasitic inductance. In this case, a DC voltage should be applied to varactors 441, 443 connected to a transmission line 445 through corresponding DC-pass filters 418, 416. Hence, to achieve the DC ports 408, 409 decoupling, an additional DC blocking capacitor 450 is connected in series with the transmission line 445. A reactance at the microwave frequency $f_0$ of the blocking capacitor 450 is at least an order of a magnitude less than $Z_0$.

Figure 5:
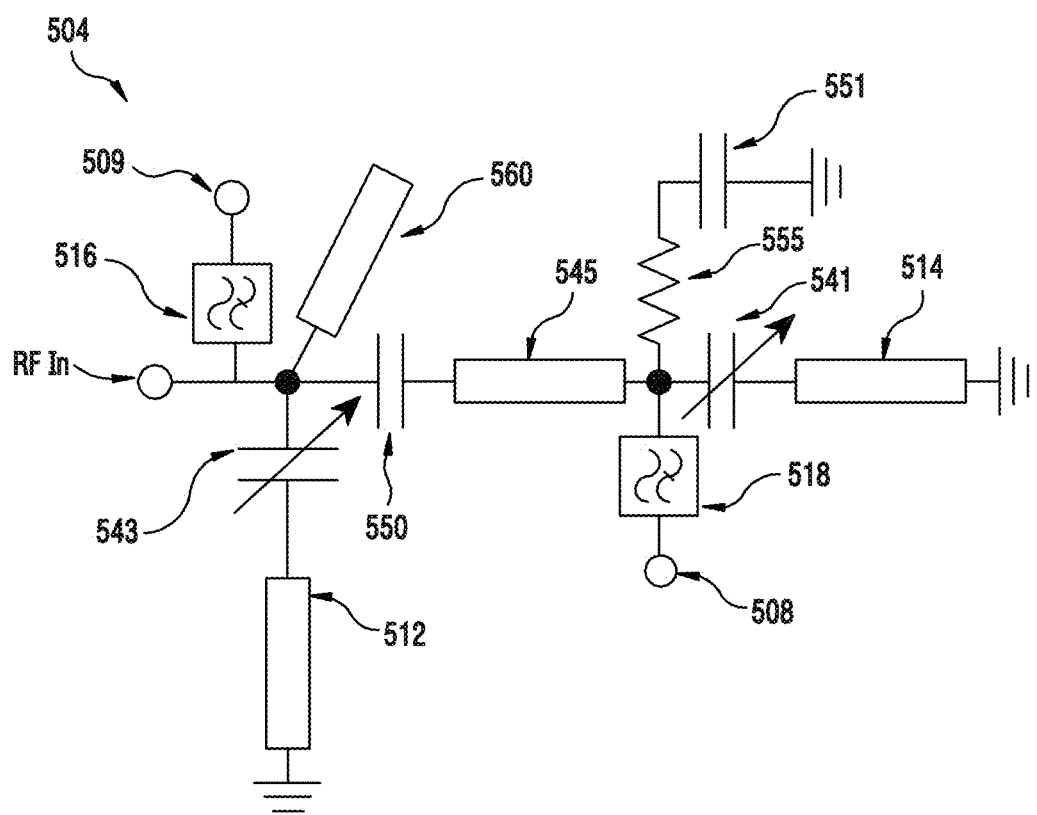
FIG. 5 illustrates a view showing an electrical diagram of a tunable reflective load with shorted lines and an equalizing resistor according to still another preferred embodiment of the phase shifter proposed according to various embodiments of the present disclosure.

FIG. 5 shows an electrical diagram of a tunable reflective load with shorted lines and an equalizing resistor according to still another preferred embodiment of the phase shifter proposed according to various embodiments of the present disclosure.

Referring to FIG. 5, the electrical diagram of the reflective load 504 includes the same parts as in the embodiment according to FIG. 4. Additionally, the reflective load 504 includes a resistor 555 having resistance $R_p$, and the resistor 555 is connected in parallel with a varactor 541. Further, a matching open circuit stub or line 560 is connected in parallel with a varactor 543. A value of $R_p$ is chosen to equalize reflection losses according to equation presented below:

$$R_p = \frac{(2Z_0)^2}{R_v} \quad \text{Equation (2)}$$

where $R_v$ is an active resistance of the varactor 541 at the microwave frequency, and $Z_0$ is characteristic impedance.

The equalizing resistor 555 is connected in series with another DC blocking capacitor 551. A reactance on the microwave frequency $f_0$ of the blocking capacitor 551 is at least an order of a magnitude less than $R_p$. The open circuit line 560 is further used for transmission losses equalization by adjusting the full reflective load reactance. A length and characteristic impedance of the open circuit line 560 is chosen from a resonance equation:

$$-\frac{1}{2\pi f_0 C_{max}} + X_s = -X_p \quad \text{Equation (3)}$$

where $X_p$ is a reactance of the open circuit line 560, $X_s$ is a full reactance of the tuning shorted line having the varactor's parasitic inductance, and $C_{max}$ is a maximal value of the tunable capacitance.

In one of the embodiments, the device structure is the same as in the previous embodiments, and there is proposed a phase shifter additionally including an equalizing resistor connected in parallel to a point where one of the varactors is connected to a transmission line between the varactors. Additionally, the structure may include a matching open circuit stub or line which is connected in parallel to a point where another varactor (being closest to the coupler) is connected to the transmission line between the varactors. Preferably, the equalizing resistor may be connected in series with another blocking capacitor. The two varactors are tuned independently to achieve the best performance in terms of the transmission losses.

Thus, in any of the above-described embodiments, each capacitance may be controlled independently which results in that the reflective load may be controlled more versatile, and the tuned capacitances may work in less heavy regime.

Figure 6:
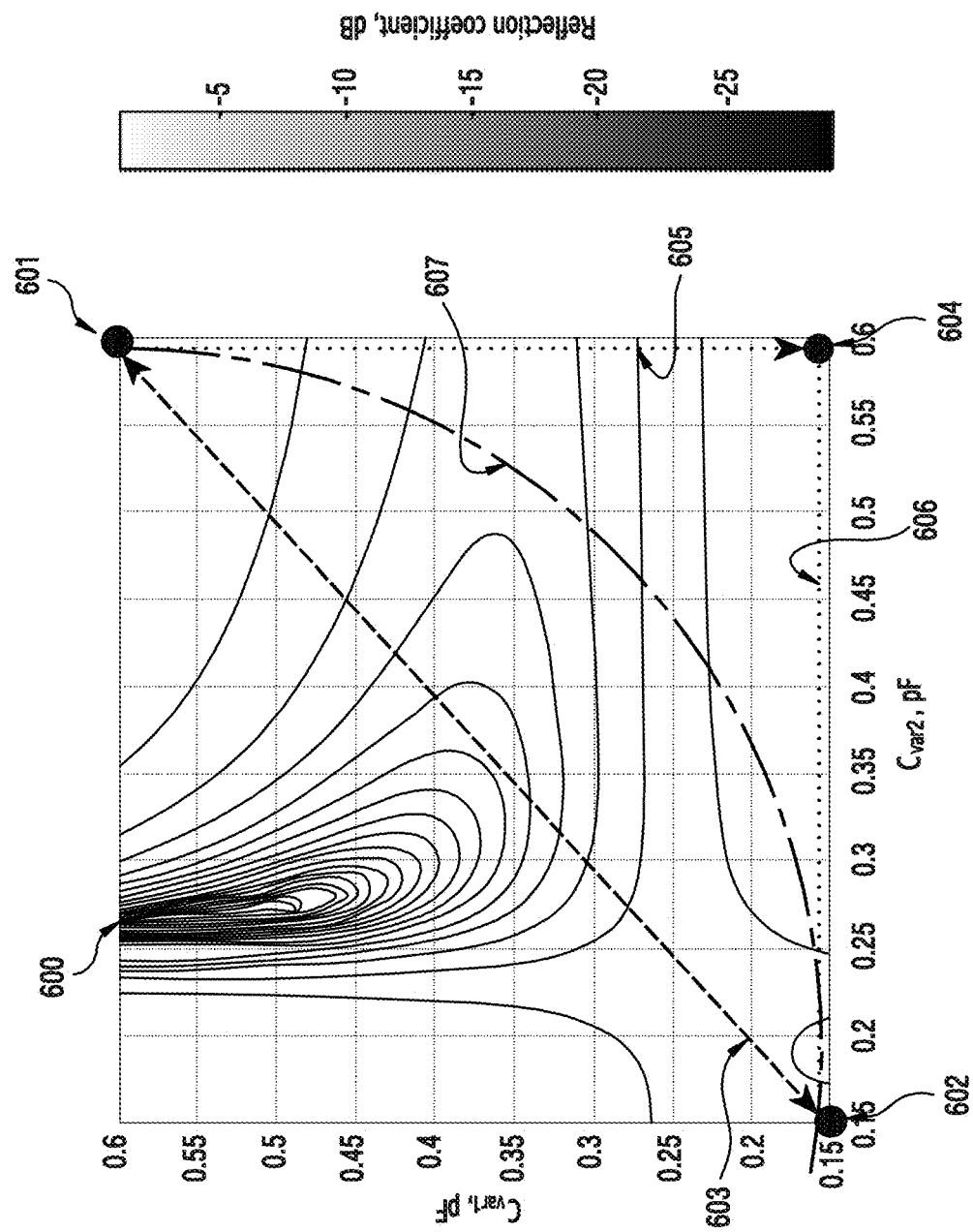
FIG. 6 illustrates a view showing a reflection coefficient magnitude map for an exemplary reflective load as a function of $C_1$, $C_2$ according to various embodiments of the present disclosure.
Figure 7:
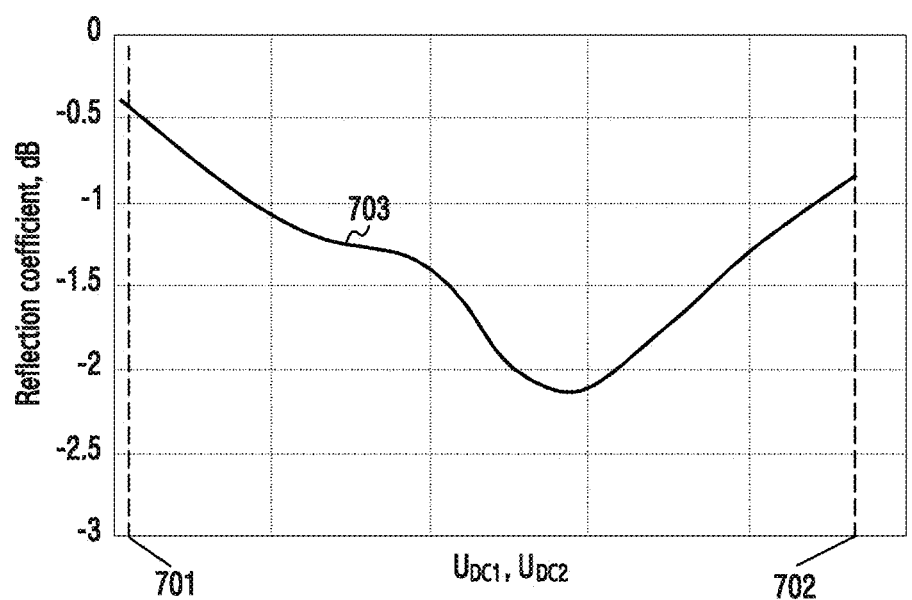
FIG. 7 illustrates a view showing a reflection coefficient magnitude for an exemplary reflective load as a function of two control voltages when both capacitances are tuned simultaneously according to various embodiments of the present disclosure.
Figure 8:
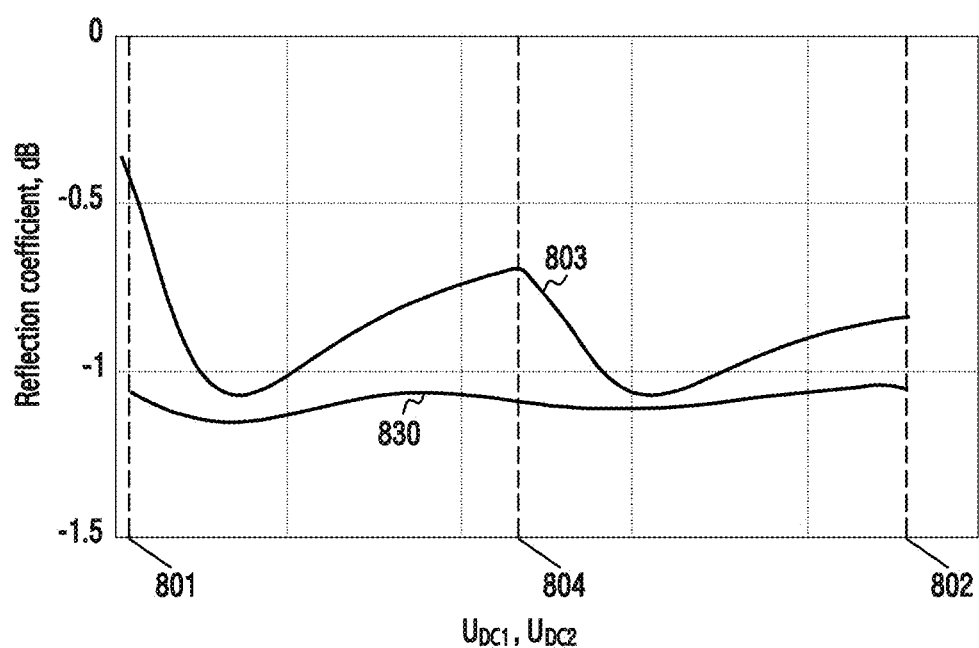
FIG. 8 illustrates a view showing a reflection coefficient magnitude for an exemplary reflective load as a function of two control voltages when both capacitances are tuned independently using an optimal tuning path with and without an equalizing resistor according to various embodiments of the present disclosure.

Referring to FIGS. 6 to 8, the advantage of the present disclosure is that the inner resonance of the reflective load 108, 110 can be effectively mitigated by the successive manipulation of the both control channels 112, 114. A reflection coefficient of the reflective load 108, 110 is a two-dimensional function of $C_{var1}$ and $C_{var2}$.

FIG. 6 shows a reflection coefficient magnitude map for an exemplary reflective load as a function of $C_1$, $C_2$ according to various embodiments of the present disclosure.

Referring to FIG. 6, the map was constructed based on a simulation of the reflective load 404 with the following parameters $Z_0$=50 Ohm, $C_{min}$=0.15 pF, $C_{max}$=0.6 pF, $R_v$=4 Ohm at $f_0$=5.8 GHz for the circuit according to the embodiment illustrated in FIG. 4. A resonance area 600 is shown by the darkest area on the map.

During the capacitance tuning from the maximal value to the minimal value, the reflective load 404 changes the state thereof from the upper right corner of the map (point 601) to the lower left corner (point 602). When all parameters are chosen according to the above Equations (1) to (3), the total phase shift during the movement along any path between these two points is 360 degrees. It should be noted that each path has its own average losses and ripple. The idea is to choose the path with minimal average losses and ripple, i.e. to avoid the resonance area 600, where the average losses and ripple are maximal.

When a known algorithm is used, i.e., both $C_{var1}$ and $C_{var2}$ are tuned simultaneously, the circuit is tuned along the diagonal path (dashed line 603, a tuning direction is shown by an arrow). It is clearly shown in FIG. 6 that the circuit goes through or nearby the resonance area 600 during the tuning. On the other hand, when each capacitance is tuned independently, the resonance may be got round by, for example, the lower right corner (point 604) as depicted in FIG. 6 as the optimal path (dotted lines 605 and 606, the tuning direction is shown by the arrow).

For some other cases, the tuning path may be formed as a quarter (¼) of the circle passing through the upper right point 601 and lower left point 602 and above the lower right point 604 of the loss map (see dash-and-dotted curved line 607 on FIG. 6).

Specifically, as a non-limiting example of the control algorithm, an algorithm as described below may be used: $C_{var1}$ is tuned from $C_{max}$ to $C_{min}$ (corresponding to the line 605 extending from point 601 to point 604), while $C_{var2}$ is maintained at $C_{max}$, and then $C_{var2}$ is tuned from $C_{max}$ to $C_{min}$ (corresponding to the line 606 extending from point 604 to point 602), while $C_{var1}$ is maintained at $C_{min}$. Another way is to perform a phase shift according to, for example, line 607 from 601 to 602 by tuning each of $C_{var1}$ and $C_{var2}$ independently.

It should be understood that any suitable means known in the art may be used to implement the above algorithm. As a non-limiting example, such means includes a program code being stored in a computer readable medium, and said program code includes instructions to realize a varactor DC control.

The varactor DC control may be implemented using, for example, a standard digital to analog converter (DAC). In this case, a digital controller or another microprocessor device being used to control the phase shifter may be configured to send a digital code to the DAC input. The DAC may be further configured to form an output analog voltage to be applied to the DC ports of the proposed phase shifter. For the most of applications, 8 bits per each DC control channel is enough for a precise phase control.

FIG. 7 shows a reflection coefficient magnitude for an exemplary reflective load as a function of two control voltages when both capacitances are tuned simultaneously according to various embodiments of the present disclosure.

Referring to FIG. 7, simulation results for the reflection coefficient magnitude as a function of two DC control voltages during the simultaneous tuning from $C_{max}$ to $C_{min}$ according to the known algorithm (path 603 shown in FIG. 6) are illustrated by curved line 703. In particular, at the initial time 701, control voltages $U_{DC1}$, $U_{DC2}$ being applied to the control DC ports are minimal, while $C_{var1}$, $C_{var2}$ are maximal, and, at the finish time 702, control voltages $U_{DC1}$, $U_{DC2}$ are maximal, while $C_{var1}$, $C_{var2}$ are minimal.

FIG. 8 shows a reflection coefficient magnitude for an exemplary reflective load as a function of two control voltages when both capacitances are tuned independently using an optimal tuning path with and without an equalizing resistor according to various embodiments of the present disclosure.

Referring to FIG. 8, the results simulated for the above proposed control algorithm are presented by curves 803 and 830. In particular, at the initial time 801, control voltages $U_{DC1}$, $U_{DC2}$ are minimal, while $C_{var1}$, $C_{var2}$ are maximal; at the intermediate time 804 (when tuning path illustrated in FIG. 6 changes the direction from line 605 to line 606 at point 604), $U_{DC1}$ is maximal and $U_{DC2}$ is minimal, while $C_{var1}$ is minimal and $C_{var2}$ is maximal; and, at the finish time 802, $U_{DC1}$, $U_{DC2}$ are maximal, while $C_{var1}$, $C_{var2}$ are minimal.

Average losses for the case without the equalizing resistor (see curve 803) were improved by 0.7 dB and the ripple level was reduced from 1.6 dB to 0.6 dB. For the case with the equalizing resistor according to the embodiment of FIG. 5 (see curve 830) the average losses were improved by 0.35 dB and the ripple level was reduced from 1.6 dB to 0.1 dB.

Thus, in the present disclosure, the resonance losses are mitigated by choosing an optimal control algorithm which results in that the average reflection losses and a transmission ripple of the reflective load are reduced. To summarize, with respect to a ripple (for example, 0.5 dB) of a pre-given acceptable value, an optimal control algorithm and/or control program may provide the least average insertion losses of the phase shift. Herein, optimizing may be performed at the stage of development, and this means that the optimal control algorithm and/or control program for varactor tuning may be used when a phase shifter using specific configurations (varactors, PCB, or etc.) is designed. Specifically, a path according to independent control may be one or more paths, and each path may have its own average losses and ripple. Herein, determined control voltage values may be final voltage values for achieving a desired phase shift, and the path may indicate a plurality of control voltage values continuously applied to the DC ports to achieve the final voltage values. Accordingly, the optimal control algorithm and/or control program may determine a plurality of paths for achieving certain control voltage values, and may determine these paths as a candidate group for the control voltage values. However, each path may have its own average losses and ripple.

Thereafter, the optimal control algorithm and/or control program may be determined, and may be loaded into a controller memory of the phase shifter at the stage of manufacturing. That is, the control algorithm and/or control program may be implemented through a controller or a processor. In addition, the control algorithm and/or control program may be essentially based on a table showing a relationship between a phase shift (from 0 to 360 degrees) and two DC voltages applied to two control channels of the phase shifter.

According to one embodiment, the controller or processor receives a request for setting an output of the phase shifter to a value given for an output phase. The controller or processor may determine two control voltages corresponding to the closest phase corresponding to the desired output phase using the above-mentioned table. Thereafter, the controller or processor may set the two control voltages to the determined values by transmitting an appropriate digital code to a DAC having an output connected to the control ports of the phase shifter.

In another embodiment, the controller or processor may receive a value on a phase shift which is used for beam steering according to a beam index determined on a higher layer. The controller or the processor may determine two control voltage values for achieving the phase change amount using the table showing the relationship between the phase shift and two DC voltages applied to the control channels, which is stored in the memory. Thereafter, the controller or processor may transmit signals to the DAC having the output connected to the control ports of the phase shifter, and may control the two control voltages based on the determined values.

The proposed phase shifter according to the embodiment shown in FIG. 2 was tested under the following conditions: Rogers R04003C substrate, MA-COM MA46H120 varactor diodes, 1-12 DC voltage range, and 5.8 GHz central frequency. Measurements were done using the Agilent PNA-X vector network analyzer.

Figure 9:
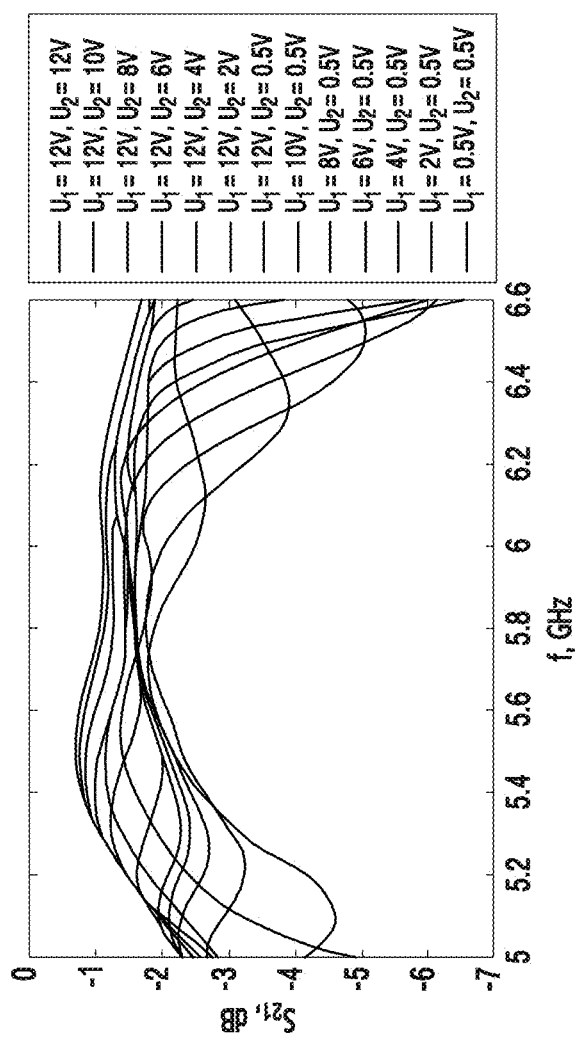
FIG. 9 illustrates a view showing a measured transmission coefficient magnitude for a full phase shifter prototype versus frequency and control voltages according to various embodiments of the present disclosure.

FIG. 9 shows a measured transmission coefficient magnitude for a full phase shifter prototype versus frequency and control voltages according to various embodiments of the present disclosure.

Referring to FIG. 9, the transmission losses are less than 2 dB for the 360° phase range, the ripple amounts are less than 0.7 dB, geometrical area of the phase shifter is about 0.5×0.5 wavelength$^2$, and figure of merit equals to 211 deg./dB, which are sufficiently better parameters than the corresponding parameters of the known systems. Comparing to the simulated transmission losses for the solution of U.S. '679 estimating about 3-5 dB, the geometrical area is about 1×0.5 wavelength$^2$, and the figure of merit estimates about 100-130 deg./dB with a sufficiently complicated design.

Figure 10:
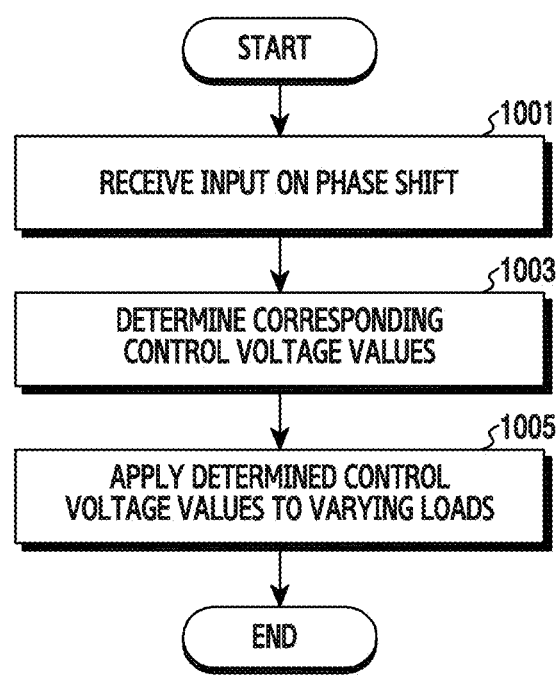
FIG. 10 illustrates a view showing a flowchart for controlling a phase in the phase shifter according to various embodiments of the present disclosure.

FIG. 10 shows a flowchart for controlling a phase in the phase shifter according to various embodiments of the present disclosure. The respective operations in FIG. 10 may be performed by the controller or processor of the phase shifter.

Referring to FIG. 10, in operation 1001, the analog phase shifter receives an input on a phase shift. For example, when the phase shifter is implemented as a part of a base station, the base station may receive feedback on a preferred beam index from a terminal, and may determine a value of a phase shift to be used for base station transmission beam steering based on the received feedback. Accordingly, the controller or processor may receive the value of the phase shift as an input. In another example, when the phase shifter is implemented as a part of a satellite tracking receiver, the satellite tracking receiver may include an antenna interferometer using four antennas, and may track a motion of a satellite under the auto control of the antenna interferometer. In response to the motion of the satellite tracked under the auto control, a phase shift of the receiver may be used. Accordingly, the controller or processor may receive a value of the phase shift according to the tracked motion of the satellite as an input.

In operation 1003, the analog phase shifter may determine corresponding control voltage values. Specifically, the controller or the processor may determine control voltage values for achieving a phase change amount using information on a relationship between a phase change amount of an RF signal and two DC voltages applied to control channels, which is stored in the memory. For example, the controller or processor receives a phase change amount that is used for beam steering, and may determine control voltage values for achieving the corresponding phase change amount. In another example, the controller or the processor may receive a phase change amount that is used for tracking a satellite, and may determine corresponding control voltage values using the table. The controller or processor may determine voltage values corresponding to the phase change amount from among a plurality of candidates, and combinations of voltage values included in the plurality of candidates may be defined in a region other than a region including combinations of voltage values causing the inner resonance of reflective loads.

In operation 1005, the analog phase shifter applies the determined control voltage values to varying loads. Specifically, the controller or processor may apply independent control voltage values corresponding to the phase change amount to reflective loads through control channels. The independent control voltage values may be applied to a DAC connected to control ports, and may be a signal having an appropriate digital code.

Although FIG. 10 depicts the phase shifter using two control voltages, the present disclosure is not limited thereto. The phase shifter according to the present disclosure may include three or more reflective loads and three or more independent control voltage values applied thereto independently.

As a non-limiting example, the use of the proposed phase shifter in a microwave radiating system is given below. One of the example is a WPT system where the proposed phase shifter is integrated inside an 8×8 transmitting antenna array with a capability of autofocusing on a receiver. In that system, a method for generating a phase distribution over an array aperture may be implemented using the proposed phase shifter.

Another exemplary system is a satellite tracking receiver where the proposed phase shifter is used for the phase adjustment during the satellite tracking by an automatic control of a four-antenna interferometer.

Still another exemplary system is a controllable oscillator where the proposed phase shifter is used for the phase adjustment.

As described above, the proposed disclosure has numerous positive effects for RF and microwave systems such as a higher link budget and higher signal quality. Hence, the proposed solution can be advantageously used in the radar antenna arrays, base station antennas, satellite communication systems, controllable oscillators, radio frequency integrated circuits (RFICs), etc. Furthermore, it is possible to design the microwave analog phase shifters based on the tunable capacitances (with operating frequencies up to 100 GHz) for the use in internet of things (IoT) sensors, wireless fidelity (Wi-Fi) and mobile communication, long distance WPT systems, etc.

Methods according to embodiments stated in claims and/or specifications of the present disclosure may be implemented in hardware, software, or a combination of hardware and software.

The software may be stored in a computer-readable storage medium. The computer-readable storage medium stores at least one program (software module) including instructions that causes, when executed by at least one processor in the electronic device, the electronic device to perform the method of the present disclosure.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs) or other type optical storage devices, or a magnetic cassette. Alternatively, any combination of some or all thereof may form a memory in which the program is stored. Further, a plurality of such memories may be included in the electronic device.

In addition, the programs may be stored in an attachable storage device which may access the electronic device through communication networks such as the internet, intranet, local area network (LAN), wide LAN (WLAN), and storage area network (SAN) or a combination thereof. Such a storage device may access a device performing an embodiment of the present disclosure, via an external port. Further, a separate storage device on the communication network may access the device performing an embodiment of the present disclosure.

In the above-described detailed embodiments of the present disclosure, a component included in the present disclosure is expressed in the singular or the plural according to a presented detailed embodiment. However, the singular form or plural form is selected for convenience of description suitable for the presented situation, and various embodiments of the present disclosure are not limited to a single element or multiple elements thereof. Further, either multiple elements expressed in the description may be configured into a single element or a single element in the description may be configured into multiple elements.

Although the present disclosure has been described with an exemplary embodiment, various changes and modifications may be suggested to one skilled in the art. It is intended that the present disclosure encompass such changes and modifications as fall within the scope of the appended claims.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An analog phase shifter comprising:
   a processor;
   a multi-port network comprising an input port for inputting a radio frequency (RF) signal and an output port for outputting a phase-changed RF signal;
   a hybrid coupler configured to operably couple the input port and the output port to a plurality of load ports; and
   variable loads coupled to the hybrid coupler via the plurality of load ports,
   wherein the processor is configured to:
      identify a combination of control voltage values that is different from at least one combination of control voltage values causing an inner resonance of the variable loads; and
      apply a plurality of independent voltages according to the identified combination of control voltage values to the variable loads.

2. The analog phase shifter of claim 1, further comprising:
   a plurality of direct current (DC) ports to which the plurality of independent voltages are applied,
   wherein the variable loads comprise tunable reflective loads,
   wherein one of the tunable reflective loads comprise two varactors separated by a quarter ($\frac{1}{4}$) wavelength transmission line,
   wherein the two varactors are connected to tuning open circuit lines to form varactor sections, respectively,
   wherein the plurality of DC ports are connected to the tuning open circuit lines via DC-pass filters, and
   wherein the quarter ($\frac{1}{4}$) wavelength transmission line is grounded via another DC-pass filter.

3. The analog phase shifter of claim 2, wherein one of the tuning open circuit lines has a length and a characteristic impedance, wherein the length and the characteristic impedance are determined to achieve a phase shift of 180 degrees from a corresponding varactor section for the one of the tuning open circuit lines.

4. The analog phase shifter of claim 3, wherein the length and characteristic impedance is based on an equation:

$$\left(-\frac{1}{2\pi f_0 C_{min}} + X_s\right) \bigg/ (2Z_0) = -2Z_0 \bigg/ \left(-\frac{1}{2\pi f_0 C_{max}} + X_s\right)$$

wherein $X_s$ is a full reactance of the one of the tuning open circuit lines having a parasitic inductance of a corresponding varactor,
$Z_0$ is the characteristic impedance,
$f_0$ is a central frequency,
$C_{max}$ is a maximal value of a tunable capacitance of the corresponding varactor, and
$C_{min}$ is a minimal value of the tunable capacitance of the corresponding varactor.

5. The analog phase shifter of claim 4, wherein the length of the one of the tuning open circuit lines is between one quarter ($\frac{1}{4}$) and one half ($\frac{1}{2}$) of a transmission line wavelength at the central frequency $f_0$.

6. The analog phase shifter of claim 1, further comprising:
   a plurality of direct current (DC) ports to which the plurality of independent voltages are applied,
   wherein the variable loads comprise tunable reflective loads,
   wherein one of the tunable reflective loads comprises two varactors separated by a quarter ($\frac{1}{4}$) wavelength transmission line,
   wherein the two varactors comprise similar are connected to tuning shorted lines connected to form varactor sections, respectively,
   wherein the plurality of DC ports are connected to the varactors via DC-pass filters, and
   wherein the quarter ($\frac{1}{4}$) wavelength transmission line is connected in series with a blocking capacitor.

7. The analog phase shifter of claim 6, wherein one of the tuning shorted lines has a length and a characteristic impedance, wherein the length and the characteristic impedance are determined to achieve a phase shift of 180 degrees from a corresponding varactor section for the one of the tuning shorted lines.

8. The analog phase shifter of claim 7, wherein the length and characteristic impedance is based on an equation:

$$\left(-\frac{1}{2\pi f_0 C_{min}} + X_s\right) \bigg/ (2Z_0) = -2Z_0 \bigg/ \left(-\frac{1}{2\pi f_0 C_{max}} + X_s\right)$$

wherein $X_s$ is a full reactance of the one of the tuning shorted line having a parasitic inductance of a corresponding varactor, $Z_0$ is the characteristic impedance, $f_0$ is a central frequency, $C_{max}$ is a maximal value of a tunable capacitance of the corresponding varactor, and $C_{min}$ is a minimal value of the tunable capacitance of the corresponding varactor.

9. The analog phase shifter of claim 8, wherein a reactance at a microwave frequency of the blocking capacitor is at least an order of a magnitude less than $Z_0$.

10. The analog phase shifter of claim 6, wherein one of the tunable reflective loads further comprise:

an equalizing resistor connected in parallel with one varactor among the two varactors; and a matching open circuit line connected in parallel with another varactor among the two varactors, wherein the equalizing resistor is further connected in series with another blocking capacitor.

11. The analog phase shifter of claim 1, further comprising:

a memory configured to store information on a relationship between each of a plurality of combinations of control voltage values and a phase change amount of the RF signal, wherein the processor is, to identify the combination of control voltage values, configured to:

obtain the phase change amount of the RF signal; and identify the combination of control voltage values corresponding to the phase change amount based on the information among the plurality of combinations of control voltage values.

12. The analog phase shifter of claim 11, wherein the plurality of the combinations of control voltage values are defined in a region other than a region comprising the at least one combination of voltage values causing the inner resonance of the variable loads.

13. An operating method of an analog phase shifter, the method comprising:

identifying a combination of control voltage values that is different from at least one combination of control voltage values causing an inner resonance of variable loads; and applying a plurality of independent voltages according to the identified combination of control voltage values to the variable loads, wherein the applied plurality of independent voltages is used to output a phase-changed radio frequency (RF) signal from an RF signal.

14. The method of claim 13, wherein the identifying of the combination of control voltage values comprises:

obtaining a phase change amount of the RF signal to output the phase-changed RF signal; and identifying the combination of the control voltage values corresponding to the phase change amount among a plurality of combinations of control voltage values, based on information on a relationship between each of a plurality of combinations of control voltage values and an amount of a phase change.

15. The method of claim 14, wherein the plurality of combinations of control voltage values are defined in a region other than a region comprising the at least one combination of control voltage values causing the inner resonance of the variable loads.

16. The method of claim 13, wherein each of the plurality of independent voltages is applied to the variable loads through an independent control channel.

17. The method of claim 16, wherein the plurality of voltages are applied to a digital to analog converter (DAC) connected to control ports of the analog phase shifter.

* * * * *